United States Patent
Shank et al.

(10) Patent No.: US 10,243,047 B2
(45) Date of Patent: Mar. 26, 2019

(54) ACTIVE AND PASSIVE COMPONENTS WITH DEEP TRENCH ISOLATION STRUCTURES

(71) Applicant: GLOBALFOUNDRIES INC., Grand Cayman (KY)

(72) Inventors: Steven M. Shank, Jericho, VT (US); Anthony K. Stamper, Burlington, VT (US); John J. Ellis-Monaghan, Grand Isle, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/372,929

(22) Filed: Dec. 8, 2016

(65) Prior Publication Data

US 2018/0166536 A1    Jun. 14, 2018

(51) Int. Cl.
| | | |
|---|---|---|
| H01L 29/10 | (2006.01) | |
| H01L 29/06 | (2006.01) | |
| H01L 23/66 | (2006.01) | |
| H01L 21/762 | (2006.01) | |
| H01L 29/78 | (2006.01) | |
| H01L 25/18 | (2006.01) | |
| H01L 21/764 | (2006.01) | |
| H01L 21/8234 | (2006.01) | |

(52) U.S. Cl.
CPC ........ H01L 29/1083 (2013.01); H01L 21/762 (2013.01); H01L 21/764 (2013.01); H01L 21/76283 (2013.01); H01L 23/66 (2013.01); H01L 25/18 (2013.01); H01L 29/0649 (2013.01); H01L 29/78 (2013.01); *H01L 21/823481* (2013.01); *H01L 2223/6683* (2013.01)

(58) Field of Classification Search
CPC .. H01L 29/1083; H01L 29/0649; H01L 23/66
See application file for complete search history.

(56) References Cited

U.S. PATENT DOCUMENTS

| | | | | |
|---|---|---|---|---|
| 4,477,310 A | * | 10/1984 | Park | H01L 21/266 257/374 |
| 6,396,107 B1 | * | 5/2002 | Brennan | H01L 27/0255 257/197 |

(Continued)

OTHER PUBLICATIONS

Hashimoto et al., "A Study on Suppressing Crosstalk Through a Thick SOI Substrate and Deep Trench Isolation", IEEE, Jul. 2013, vol. 1, No. 7, 7 pages.

(Continued)

*Primary Examiner* — Ida M Soward
(74) *Attorney, Agent, or Firm* — Michael LeStrange; Andrew M. Calderon; Roberts Mlotkowski Safran Cole & Calderon, P.C.

(57) ABSTRACT

The present disclosure relates to semiconductor structures and, more particularly, to active and passive radio frequency (RF) components with deep trench isolation structures and methods of manufacture. The structure includes a bulk high resistivity wafer with a deep trench isolation structure having a depth deeper than a maximum depletion depth at worst case voltage bias difference between devices which are formed on the bulk high resistivity wafer.

20 Claims, 4 Drawing Sheets

(56) References Cited

U.S. PATENT DOCUMENTS

| | | | | |
|---|---|---|---|---|
| 6,448,124 | B1* | 9/2002 | Coolbaugh | H01L 21/76224 257/E21.546 |
| 7,419,863 | B1* | 9/2008 | Bulucea | H01L 21/823807 257/E21.585 |
| 7,427,803 | B2 | 9/2008 | Chao et al. | |
| 7,838,956 | B2* | 11/2010 | McCarten | H01L 27/1463 257/447 |
| 7,855,104 | B2* | 12/2010 | Voldman | H01L 21/8249 438/133 |
| 7,902,013 | B1* | 3/2011 | Babcock | H01L 21/761 257/E21.633 |
| 7,915,155 | B2* | 3/2011 | Moens | H01L 21/3081 257/341 |
| 8,410,534 | B2* | 4/2013 | Voldman | H01L 21/28525 257/296 |
| 8,692,352 | B2* | 4/2014 | Onishi | H01L 21/764 257/397 |
| 9,048,284 | B2 | 6/2015 | McPartlin et al. | |
| 9,093,287 | B2* | 7/2015 | Ko | H01L 27/0629 |
| 9,508,845 | B1* | 11/2016 | Lin | H01L 29/66659 |
| 9,570,546 | B2* | 2/2017 | Vanhoucke | H01L 29/063 |
| 9,679,888 | B1* | 6/2017 | Lee | H01L 27/0266 |
| 9,705,026 | B2* | 7/2017 | Willemen | H01L 31/173 |
| 2005/0280093 | A1* | 12/2005 | Voldman | H01L 27/0277 257/355 |
| 2010/0032796 | A1* | 2/2010 | Brown | H01L 21/76289 257/510 |
| 2010/0171148 | A1* | 7/2010 | Liu | H01L 27/0262 257/133 |
| 2011/0073944 | A1* | 3/2011 | Tsukihara | H01L 21/76224 257/337 |
| 2014/0147983 | A1* | 5/2014 | Gendron | H01L 27/0259 438/309 |
| 2014/0291767 | A1* | 10/2014 | Lee | H01L 21/76229 257/368 |
| 2015/0024570 | A1* | 1/2015 | Joseph | G06F 17/5009 438/343 |
| 2015/0294898 | A1* | 10/2015 | Yamaguchi | H01L 21/76224 257/506 |
| 2015/0371893 | A1* | 12/2015 | Chou | H01L 21/76283 257/621 |
| 2015/0380447 | A1* | 12/2015 | Chou | H01L 27/1463 257/437 |
| 2016/0043217 | A1* | 2/2016 | Cai | H01L 27/0922 257/337 |
| 2016/0071927 | A1* | 3/2016 | Hurwitz | H01L 29/66477 257/347 |
| 2016/0181419 | A1* | 6/2016 | Ryu | H01L 29/7816 257/343 |
| 2016/0204128 | A1* | 7/2016 | Baars | H01L 21/308 257/296 |
| 2016/0268159 | A1* | 9/2016 | Kao | H01L 27/1463 |
| 2017/0062610 | A1* | 3/2017 | Agam | H01L 29/7823 |
| 2017/0077296 | A1* | 3/2017 | Yang | H01L 29/7823 |
| 2017/0084628 | A1* | 3/2017 | Kim | H01L 27/1203 |
| 2017/0092718 | A1* | 3/2017 | Murata | H01L 21/02216 |
| 2017/0125584 | A1* | 5/2017 | Zhang | H01L 21/26513 |
| 2018/0130903 | A1* | 5/2018 | Lin | H01L 29/7816 |

OTHER PUBLICATIONS

Ohguro et al., "High performance digital-analog mixed device on a Si substrate with resistivity beyond 1 kΩ cm", IEEE, 2000, 4 pages.
Taiwanese Office Action dated Oct. 31, 2018 in related of TW Application No. 106103219, 20 pages.

* cited by examiner

ACTIVE AND PASSIVE COMPONENTS WITH DEEP TRENCH ISOLATION STRUCTURES

FIELD OF THE INVENTION

The present disclosure relates to semiconductor structures and, more particularly, to active and passive radio frequency (RF) components with deep trench isolation structures and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex and commoditized, there is an increasing need to provide higher performance and lower price points for the wireless communication components. A significant fraction of the cost of manufacturing an RF switch, for example, is the cost to engineer very high linearity such that harmonic distortion is extremely low and meets product specifications.

RF devices are typically manufactured on high resistivity silicon wafers or substrates to achieve the needed rf linearity. State-of-the-art trap rich silicon on insulator (SOI) high resistivity substrates offer excellent vertical isolation and linearity, but can be up to 50% of the total manufacturing cost because they can be quadruple the cost of a high resistivity non-SOI substrates. i.e., a rf device formed on a trap rich SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises a bulk high resistivity wafer with a deep trench isolation structure having a depth deeper than a maximum depletion depth at worst case voltage bias difference between devices which are formed on the bulk high resistivity wafer.

In an aspect of the disclosure, a structure comprises: a bulk wafer having at least one well region; a plurality of radio frequency (RF) devices formed on the bulk wafer over the at least one well region; and a deep trench isolation structure extending within the bulk wafer below the at least one well region and structured to prevent coupling between device depletion regions of the plurality of RF devices.

In an aspect of the disclosure, a method comprises: forming at least one well in a bulk high resistivity substrate; forming a plurality of active devices on the bulk high resistivity substrate and above the at least one well; and forming a deep trench isolation structure in the substrate and between adjacent active devices. The deep trench isolation structure is formed below the at least one well and to a depth selected to be deeper than a worst case depletion depth at a highest wafer resistivity specification.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
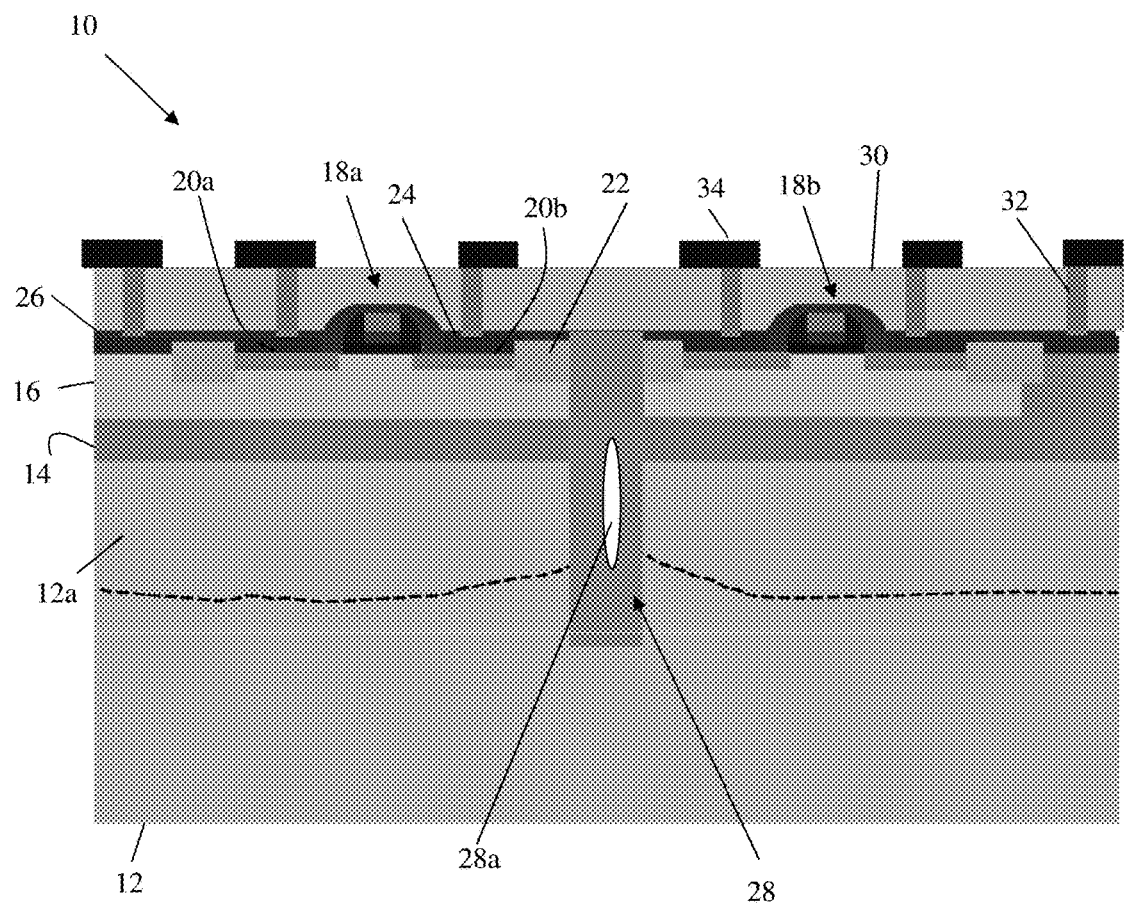
FIG. 1 shows a structure and respective fabrication processes in accordance with aspects of the present disclosure.

The present disclosure relates to semiconductor structures and, more particularly, to active and passive components with deep trench isolation structures and methods of manufacture. More specifically, the present disclosure relates to radio frequency (RF) switches with deep trench isolation structures used in front end module transceivers. Advantageously, the deep trench isolation structures used with the RF switches improves leakage currents, noise, and linearity (harmonics) for devices built on bulk Si substrates and high resistivity bulk Si substrates.

More specifically, structures and methods described herein use a bulk Si substrate with deep trench isolation structures between devices to prevent coupling between device depletion regions. The use of the bulk Si substrate will significantly reduce cost compared to SOI substrates. For example, as should be understood by those of skill in the art, bulk high resistivity Si substrates can cost 4 to 5 times less than high resistivity SOI substrates, which results in a significant cost savings in total manufacturing cost. Also, due to these cost savings, additional processing can be added to improve device performance, while still maintaining a significant cost advantage compared to SOI applications.

In embodiments, the deep trench isolation structures surround FET switches and other CMOS devices to provide isolation for depletion regions. In fact, the deep trench isolation structures described herein can be used with any active device with a different substrate bias. The deep trench isolation structures can be used in dual or triple well stack switch FET with spacing limited by minimum ground rule (e.g., trench CD and overlay), not depletion depth or coupling to adjacent stacks. As will be discussed, the deep trench isolations are different from known trench isolation (TI) or shallow trench isolation (STI) because of their depth. TI or STI are shallow enough, i.e. a maximum of a few microns deep, to be formed using standard silicon RIE processes while the deep trench isolation structures required for this invention are formed several 10's of microns deep using through silicon via etch processes.

In embodiments, the deep trench isolation structures can be about, e.g., 10-150 μm deep, which can easily provide isolation from well charges that produce harmonic distortion. In alternative embodiments, the depth of the deep trench isolation structures can be chosen to be deeper than a worst case depletion depth at the highest wafer resistivity specification (e.g., worst case at any post backside grind depth). Moreover, the deep trench isolation structures can extend to the backside grind interface which will further decouple the active and passive devices from each other by eliminating a DC leakage path. It is also noted that engineering to match SOI ground rules and linearity, however, presents significant challenges in the bulk Si implementations.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

FIG. 1 shows a structure and respective fabrication processes in accordance with aspects of the present disclosure. In particular, the structure 10 is an RF switch FET with a triple well (e.g., n-type triple well) with FET switch stacks separated by a deep trench isolation structure. More specifically, the structure 10 includes a substrate 12 which is implanted with argon to form low mobility regions in the substrate 12, such that electrical charges will have low mobility in these regions. The substrate 12 can be a bulk Si and more specifically a p-Si handle wafer with high resistivity. In embodiments, the high resistivity bulk Si substrate can be in the range of about between 1 Kohm-cm to greater than 10 Kohm-cm, as an illustrative example. Higher resistivities can also be contemplated up to 20 Kohm-cm. It should be recognized that resistivities of 10K ohm-cm are sufficient to significantly reduce substrate induced harmonic distortion. In additional embodiments, the substrate can be composed of any suitable semiconductor materials such as, e.g., SiGe, SiGeC, SiC, GaAs, InAs, InP, and other III/V or II/VI compound semiconductors.

Still referring to FIG. 1, an n-triple well region 14 is provided within the substrate 12. In embodiments, the n-triple well region 14 can be formed by any conventional ion implantation or diffusion process using, e.g., phosphorus or arsenic, to attain a suitable well depth and doping profile. The n-triple well region 14 can reduce leakage currents of transistors 18a, 18b. A p-well region 16 is formed in the n-triple well region 14. In embodiments, the p-well region 16 can be formed by any conventional ion implantation or diffusion process using, e.g., boron, to attain a suitable well depth and doping profile.

A plurality of transistors 18a, 18b are formed on the substrate 12. In embodiments, the transistors 18a, 18b can be active RF devices, e.g., RF switches. Note that transistors 18a and 18b can be formed using multiple gates in an array of alternating source/drain/source/drain/ . . . configuration, as known in the art. The configuration shown is called a 2 stack since there are two isolated FET's that are connected in series. As should be understood by those of ordinary skill in the art, the transistors 18a, 18b can be formed by conventional CMOS processes including deposition of gate dielectrics (e.g., high-k dielectrics such as Hafnium oxide, etc.), followed by gate metals (e.g., different work function metals), patterning of the materials using lithography and etching (e.g., reactive ion etching (RIE) to form the gate stacks, followed by sidewall formation, e.g., oxide or nitride materials deposited on the gate stacks). Source regions 20a and drain regions 20b can be formed within the substrate 12 or on the substrate 12 (for raised source and drain regions) using conventional dopant or ion implantation processes such that one of ordinary skill in the art would understand without requiring further explanation.

Shallow trench isolation (STI) structures 22 are formed in the substrate 12 and more specifically between the transistors 18a, 18b. In embodiments, the STI structures 22 can be formed with the p-wells 16 and can be composed of oxide material, as an example. The STI structures 22 can be formed by using conventional lithography, etching and deposition steps, followed by a chemical mechanical polishing (CMP) step. In embodiments, the STI structures 22 can be formed prior to the formation of the transistors 18a, 18b.

As further shown in FIG. 1, silicide regions 24 are formed on the source and drain regions 20a, 20b. In embodiments, the silicide process begins with deposition of a thin transition metal layer, e.g., nickel, cobalt or titanium, over fully formed and patterned semiconductor devices (e.g., doped or ion implanted source and drain regions 20a, 20b and respective devices 18a, 18. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 24 in the active regions of the devices, e.g., transistors 18a, 18b. A barrier layer 26 can be formed over the silicide contacts 24 in the active regions of the devices, e.g., transistors 18a, 18b. The barrier layer 26 can be a barrier nitride film deposited using a conventional deposition process, e.g., CVD process.

In embodiments, a deep trench isolation structure 28 is formed between the transistors 18a, 18b and within the substrate 12. In more specific embodiments, the deep trench isolation structure 28 are formed to surround each of the transistors 18a, 18b. By providing the deep trench isolation structure 28, it is now possible to prevent triple well to substrate depletion regions from merging, thereby reducing harmonics. Also, the deep trench isolation structure 28 isolates n-triple well regions 14 and p-well regions 16 from adjacent n-triple well and p-well regions.

In embodiments, the deep trench isolation structure 28 will be formed through a STI structure 22 and beyond a depth of the triple well region 14. As the depletion into the substrate 12 greater than 30 µm occurs for resistivities greater than 10K ohm-cm, a depth of the deep trench isolation structure 28 of 30 µm or greater should be sufficient. For example, in embodiments, the deep trench isolation structure 28 can have a depth of about 10 µm to about 150 µm and preferably 30 to 60 µm and even more preferably deeper than region 12a which represents a depleted region within the substrate 12 that couples the triple well regions together. In embodiments, the deep trench isolation structure 28 can be filled with $SiO_2$ or other insulator material.

The deep trench isolation structure 28 can be formed by lithography and etching processes (e.g., RIE chemistries selective to the materials of the barrier layer 26, STI 22 and substrate 12), followed by a deposition process, e.g., a combination of a sidewall oxidation and CVD oxide fill process. For example, a resist can be formed over the substrate 12 and exposed to energy (light) to form a pattern (opening). A RIE process with selective chemistries can be used to form a deep trench. In embodiments, the deep trench can have a width of about 0.1 microns to about 10 microns; although other dimensions are contemplated herein based on the specific dimensions between the adjacent transistors 18a, 18b. In embodiments, the deep trench can etched using any method including a Bosch etch process, which consists of alternating etch, using SF6, and polymer deposition processes, as known in the art. The deep trench can be filled with an oxide material or other insulator material, followed by a CMP process. For example, the deep trench can be lined with oxide and nitride or oxide alone, and then filled with CVD oxide or other dielectric material. In embodiments, the oxide fill process can create an air gap 28a within the deep trench by a pinch-off process, hence decreasing its capacitance even further.

Following the formation of the deep trench isolation structure 28, an interlevel dielectric material 30 can be formed over the exposed surfaces of the structure, e.g., over the transistors 18a, 18b and barrier layer 26. The interlevel dielectric material 30 can be an oxide material deposited using a conventional deposition process, e.g., CVD. Contacts 32 can be formed within the interlevel dielectric material 30 using conventional lithography, etching and deposition of metal or metal alloy processes. The contacts 32 will be in direct contact with the silicide regions 24 and gate regions of the transistors (FETs) 18a, 18b. Wiring layers and other back end of the line structures 34 are formed in contact with the contacts 32 using, again, conventional CMOS deposition and patterning processes. Note that the deep trench can be formed at any step in the IC manufacturing process, e.g., prior to the STI process 22.

Figure 2:
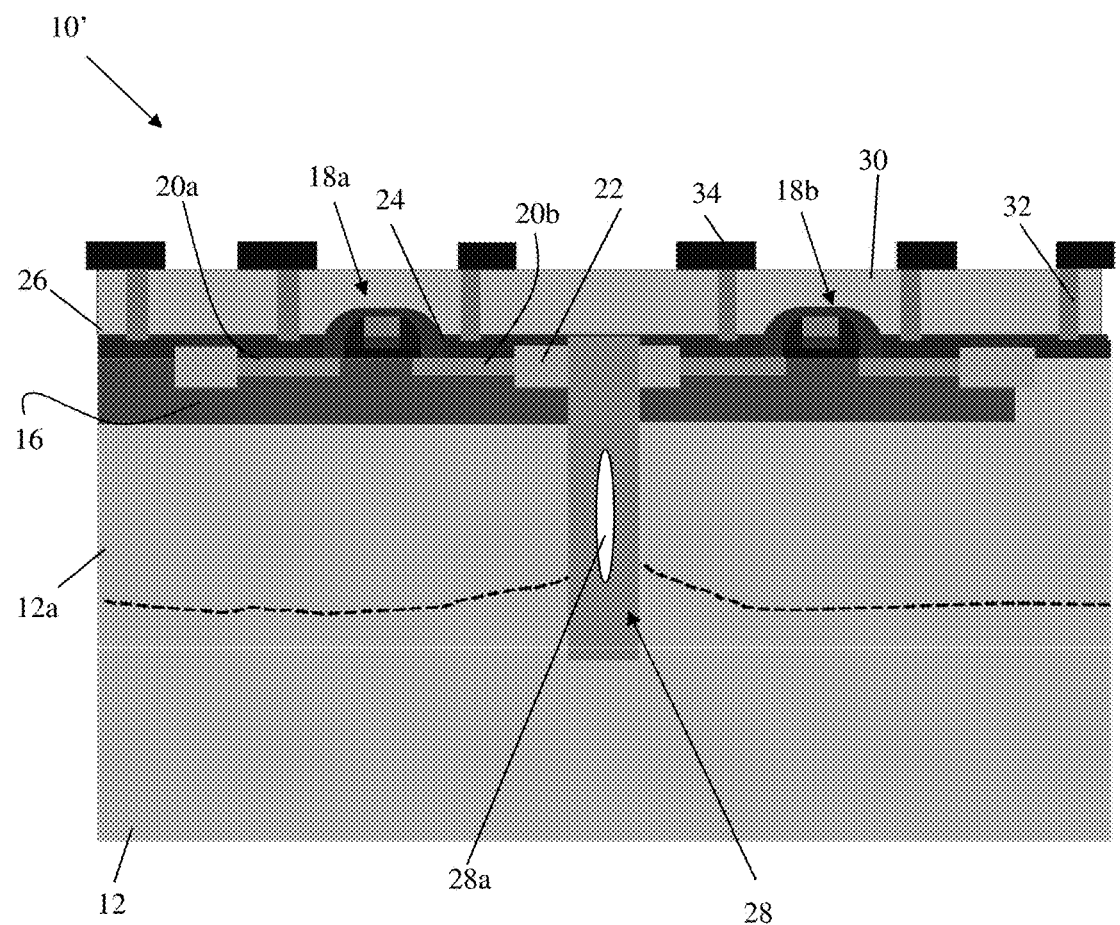
FIG. 2 shows a structure and respective fabrication processes in accordance with additional aspects of the present disclosure.

FIG. 2 shows a structure and respective fabrication processes in accordance with additional aspects of the present disclosure. More specifically, the structure 10' shown in FIG. 2 includes the structures and materials described in FIG. 1, except that the triple well region has been removed. That is, in the embodiment shown in FIG. 2, a p-well region 14 is formed in the substrate 12. The structure without a triple well can be referred to as a double well.

For example, FIG. 2 shows a substrate 12 which can be implanted with argon to form low mobility regions in the substrate 12. The substrate 12 can be a bulk Si and more specifically a p-Si handle wafer with high resistivity on the order of 1 Kohm-cm to greater than 10 Kohm-cm, as an illustrative example. A plurality of transistors 18a, 18b are formed on the substrate 12, separated by STI 22 structures. In embodiments, the transistors 18a, 18b can be active RF devices, e.g., RF switches. Silicide regions 24 are formed on the source and drain regions 20a, 20b and make contact with contacts 32.

In this embodiment, the deep trench isolation structure 28 is formed between the transistors 18a, 18b and within the substrate 12 beyond a depth of the p-well region 16 and, more specifically, below the depletion region 12a. In this embodiment, the elimination of triple well regions reduces harmonics by eliminating the triple well to p-well junctions and the triple well to substrate junctions. The deep trench isolation structure 28 isolates p-well regions from adjacent p-well regions and provides further isolation to low level currents within the high resistivity substrate.

Figure 3:
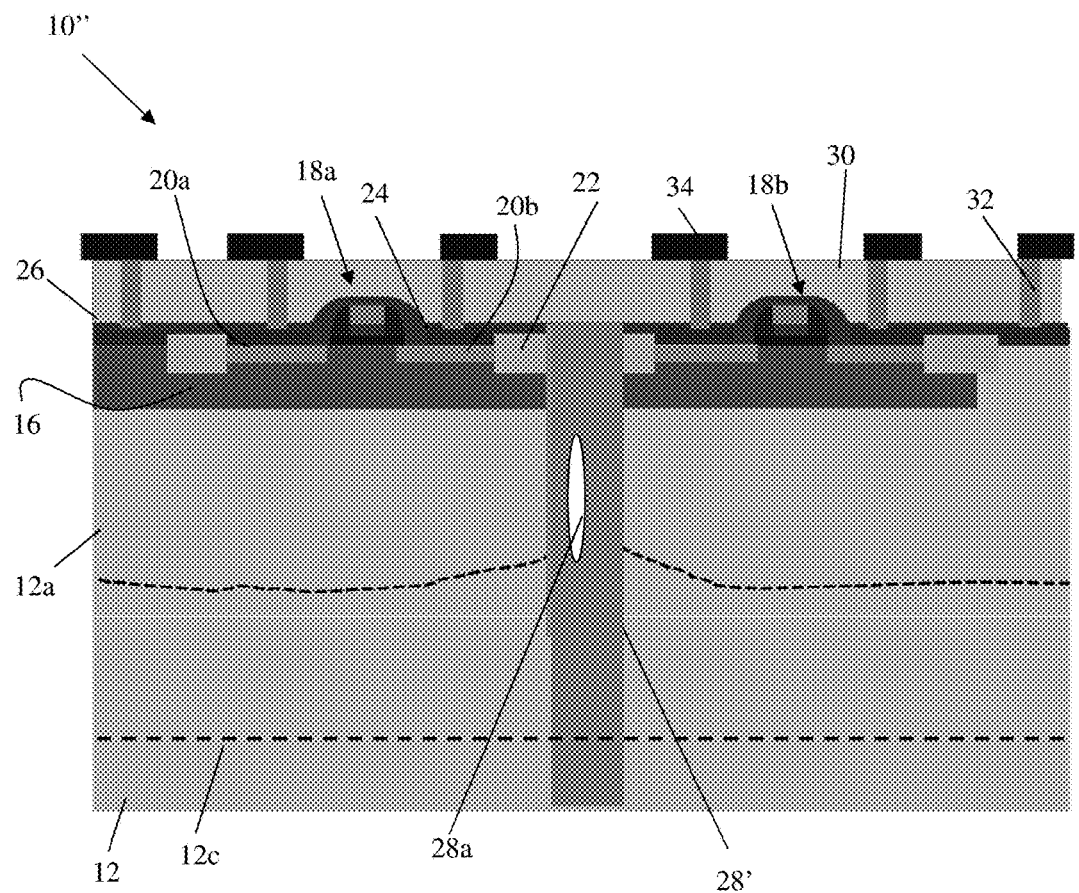
FIG. 3 shows a structure and respective fabrication processes in accordance with yet additional aspects of the present disclosure.

FIG. 3 shows a structure and respective fabrication processes in accordance with yet additional aspects of the present disclosure. More specifically, the structure 10" shown in FIG. 3 includes the structures and materials described in FIG. 2, except that the deep trench isolation structure 28' now extends to a backside grind interface 12c. In an alternative embodiment, the structure 10" shown in FIG. 3 can include the structures and materials described in FIG. 1 (e.g., the triple well), except that the deep trench isolation structure 28' now extends to a backside grind interface 12c. In either scenario, the backside of the substrate 12 is ground to expose the deep trench isolation structure 28'. In this way, the deep trench isolation structure 28 completely eliminates DC leakage path as the wafer below the backside grind interface 12c is removed at wafer finishing step. The deep trench isolation 28' bottom surface is shown filled with dielectric. In embodiments, the bottom interface could be filled from wafer front side processing, wafer back side processing, or could be left partially or completely hollow. If it is filled from wafer back side processing, then the fill material could be an insulator or conductor. The only requirement is that there is some dielectric in the deep trench isolation 28' to provide mechanical stability.

Figure 4:
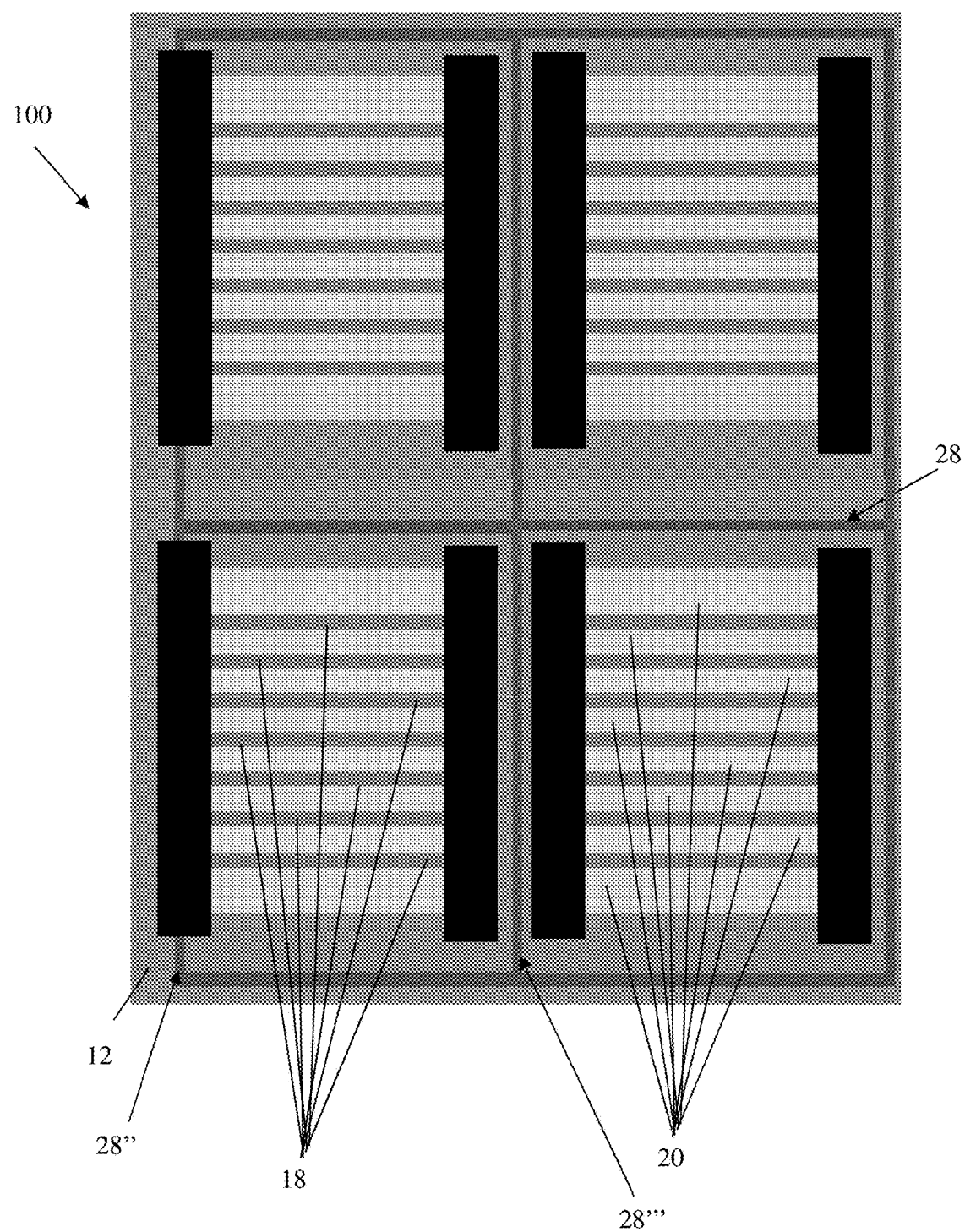
FIG. 4 shows a layout view of the structures of FIGS. 1-3 in accordance with aspects of the present disclosure.

FIG. 4 shows a top view layout view of the structures of FIGS. 1-3 in accordance with aspects of the present disclosure. More specifically, the layout view 100 shows a plurality of transistors 18, e.g., RF switches or other FETs, aligned in parallel. Source and drain regions 20 are provided between the plurality of transistors 18. A common gate 50 is shown connected to each of the plurality of transistors 18. In embodiments, the common gate 50 can be a poly gate, for example. Deep trench isolation structures 28 can be provided underneath and/or on a side of the common gate 50 or any combination thereof. For example, the deep trench isolation structures 28" can be underneath the common gate 50a and the deep trench isolation structures 28'" can be on a side of the common gate 50b. It should further be understood that multiple layouts shown in FIG. 4 can be provided, with a deep trench isolation structures 28 shared amongst upper and lower of the plurality of transistors 18.

In comparison to the structures described herein, high resistivity p-Si handle wafer applications provide improved linearity by reducing substrate carrier induced harmonics; however, high resistivity depletion regions can extend 5-100 µm deep or more into the substrate, resulting in leakage between neighboring devices and harmonic distortion. Triple wells block depletion regions from merging, i.e., depletion regions of neighboring p-wells and prevents DC substrate current from interacting with p-well region and FET. However, merged triple well depletion regions can result in harmonic distortion due to the coupling between the n-type triple well regions, add parasitic capacitance, which degrades NFET switch electrical properties such as off capacitance (Coff), and adds cost. Triple well regions also result in additional electrical junctions that add non-linear capacitances that further increase harmonic distortion. These issues are now addressed and solved at a lower cost by implementing the structures and methods described herein. Note that, although the description is shown referring to NFET switches, any active or passive device formed on high resistivity silicon substrates could use the fabrication processes and result in structures to improve device isolation and linearity.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a bulk high resistivity wafer with a deep trench isolation structure having a depth deeper than a maximum depletion depth at worst case voltage bias difference between devices which are formed on the bulk high resistivity wafer and separated by a shallow trench isolation structure, wherein the deep trench isolation structure is formed through the shallow trench isolation structure and extends below a depletion region of the bulk high resistivity wafer,
wherein the bulk high resistivity wafer includes a triple well region of a first dopant type, a well region of a second dopant type formed in the triple well region, and the deep trench isolation structure is formed though at least the triple well region and extends below the triple well region and the well region, to below a depletion region of the bulk high resistivity wafer.

2. The structure of claim 1, wherein the bulk high resistivity wafer is a bulk Si wafer with a resistivity of about 1 Kohm-cm to greater than 10 Kohm-cm.

3. The structure of claim 1, wherein the devices are active devices.

4. The structure of claim 3, wherein the bulk high resistivity wafer includes triple well regions and well regions in the triple well regions, and the deep trench isolation structure is formed through and extends below the triple well regions to prevent triple well to substrate depletion regions from merging and isolate adjacent the triple well regions and p-well regions.

5. The structure of claim 3, wherein the active devices are radio frequency switches.

6. The structure of claim 1, wherein the deep trench isolation structure surrounds each of the devices.

7. The structure of claim 1, wherein the bulk high resistivity wafer includes well regions, and the deep trench isolation structure is formed through and below at least one of the well regions.

8. The structure of claim 1, wherein the deep trench isolation structure is formed to a backside grind interface of the bulk high resistivity wafer to completely isolate the well regions and active devices from DC substrate currents.

9. The structure of claim 1, wherein the deep trench isolation structure is composed of insulator material and lined sidewalls.

10. The structure of claim 1, wherein the deep trench isolation structure is composed of insulator material and an airgap.

11. The structure of claim 10, wherein the deep trench isolation structure extends to a backside grind interface of the bulk high resistivity wafer.

12. The structure of claim 11, wherein the bulk high resistivity wafer is a bulk Si wafer with a resistivity of about 20 Kohm-cm.

13. The structure of claim 12, wherein the first dopant type is an n-type dopant and the second dopant type is a p-type dopant.

14. A structure comprising:
a bulk wafer having at least one well region;
a plurality of radio frequency (RF) devices formed on the bulk wafer over the at least one well region;
at least one shallow trench isolation structure between the plurality of RF devices;
a barrier layer formed over the at least one shallow trench isolation structure; and
a deep trench isolation structure formed through the barrier layer and the at least one shallow trench isolation structure and extending within the bulk wafer below and through the at least one well region and structured to prevent coupling between device depletion regions of the plurality of RF devices,
wherein the bulk high resistivity wafer is a Si wafer which includes a triple well region of a first dopant type, a well region of a second dopant type formed in the triple well region, and the deep trench isolation structure is formed though at least the triple well region and extends below the triple well region and the well region, and below a depletion region of the Si wafer.

15. The structure of claim 14, wherein the at least one well region is a well region formed in a triple well region.

16. The structure of claim 14, wherein the bulk wafer is a semiconductor bulk wafer with resistivity of about 1 Kohm-cm to greater than 10 Kohm-cm.

17. The structure of claim 14, wherein the deep trench isolation structure surrounds each of the plurality of RF devices.

18. The structure of claim 14, wherein the deep trench isolation structure extends below a depletion region of the bulk wafer.

19. The structure of claim 14, wherein the deep trench isolation structure is formed to a backside grind interface of the bulk substrate to completely isolate adjacent well regions and the RF devices from DC substrate currents.

20. The structure of claim 14, wherein the deep trench isolation structure is composed of insulator material and an airgap.

* * * * *